United States Patent
Young et al.

(10) Patent No.: US 9,303,311 B2
(45) Date of Patent: Apr. 5, 2016

(54) SUBSTRATE PROCESSING SYSTEM WITH MECHANICALLY FLOATING TARGET ASSEMBLY

(75) Inventors: Donny Young, Cupertino, CA (US); Alan Ritchie, Menlo Park, CA (US); Uday Pai, San Jose, CA (US); Muhammad Rasheed, San Jose, CA (US); Keith A. Miller, Mountain View, CA (US)

(73) Assignee: APPLIED MATERIALS, INC., Santa Clara, CA (US)

(*) Notice: Subject to any disclaimer, the term of this patent is extended or adjusted under 35 U.S.C. 154(b) by 952 days.

(21) Appl. No.: 13/435,949

(22) Filed: Mar. 30, 2012

(65) Prior Publication Data
US 2013/0256125 A1    Oct. 3, 2013

(51) Int. Cl.
*C23C 14/24* (2006.01)
*C23C 14/34* (2006.01)
*H01J 37/34* (2006.01)
*C23C 14/35* (2006.01)

(52) U.S. Cl.
CPC .............. *C23C 14/3407* (2013.01); *C23C 14/35* (2013.01); *H01J 37/3417* (2013.01); *H01J 37/3435* (2013.01)

(58) Field of Classification Search
CPC .......................... H01J 37/3415; H01J 37/3435
USPC .............. 204/298.12, 298.11, 298.08, 298.16
See application file for complete search history.

(56) References Cited

U.S. PATENT DOCUMENTS 5,676,810 A * 10/1997 Schwendener .......... 204/298.09
2010/0252417 A1 * 10/2010 Allen et al. .............. 204/192.12

OTHER PUBLICATIONS

U.S. Appl. No. 13/435,956, filed Mar. 30, 2012, Ritchie et al.
U.S. Appl. No. 13/435,766, filed Mar. 30, 2012, Ritchie et al.
U.S. Appl. No. 13/436,766, filed Mar. 30, 2012, Young et al.

* cited by examiner

*Primary Examiner* — Jason M Berman
(74) *Attorney, Agent, or Firm* — Moser Taboada; Alan Taboada

(57) ABSTRACT

Substrate processing systems are provided herein. In some embodiments, a substrate processing system may include a target assembly having a target comprising a source material to be deposited on a substrate; a grounding assembly disposed about the target assembly and having a first surface that is generally parallel to and opposite a backside of the target assembly; a support member coupled to the grounding assembly to support the target assembly within the grounding assembly; one or more insulators disposed between the backside of the target assembly and the first surface of the grounding assembly; and one or more biasing elements disposed between the first surface of the grounding assembly and the backside of the target assembly to bias the target assembly toward the support member.

20 Claims, 3 Drawing Sheets

SUBSTRATE PROCESSING SYSTEM WITH MECHANICALLY FLOATING TARGET ASSEMBLY

FIELD

Embodiments of the present invention generally relate to substrate processing systems.

BACKGROUND

A physical vapor deposition (PVD) chamber may include a chamber lid that is removable from the chamber body, for example, for chamber cleaning, maintenance or the like. The chamber lid may include non-vacuum regions, such as regions between a target assembly and grounding assembly of the chamber lid, or regions that hold a magnetron assembly, such as a cavity formed in the target assembly. The inventors have discovered that if a sufficient seal between non-vacuum regions of the chamber lid and regions of the chamber lid, such as the source material of the target are not established, then a sufficient vacuum seal between the chamber lid and the chamber body cannot be realized. A poor vacuum in the process chamber may result in diminished processing of substrates in the chamber. Further, poor contact between adjacent surfaces of the chamber lid and the chamber body due to weak vacuum forces can result in arcing between these surfaces.

Accordingly, the present invention provides substrate processing apparatus that may provide an improved capability for forming a vacuum in a process chamber.

SUMMARY

Substrate processing systems are provided herein. In some embodiments, a substrate processing system may include a target assembly having a target comprising a source material to be deposited on a substrate; a grounding assembly disposed about the target assembly and having a first surface that is generally parallel to and opposite a backside of the target assembly; a support member coupled to the grounding assembly to support the target assembly within the grounding assembly; one or more insulators disposed between the backside of the target assembly and the first surface of the grounding assembly; and one or more biasing elements disposed between the first surface of the grounding assembly and the backside of the target assembly to bias the target assembly toward the support member.

In some embodiments, a substrate processing system may include a target assembly having a target comprising a source material to be deposited on a substrate and having a source distribution plate opposing a backside of the target and electrically coupled to the target along a peripheral edge of the target; a grounding assembly disposed about the target assembly and having a first surface that is generally parallel to and opposite a backside of the target assembly; a support member coupled to the grounding assembly to support the target assembly within the grounding assembly; one or more insulators disposed between the source distribution plate and the grounding plate; and one or more biasing elements disposed between the first surface of the grounding plate and the source distribution plate to bias the target assembly toward the support member.

Other and further embodiments of the present invention are described below.

BRIEF DESCRIPTION OF THE DRAWINGS

Embodiments of the present invention, briefly summarized above and discussed in greater detail below, can be understood by reference to the illustrative embodiments of the invention depicted in the appended drawings. It is to be noted, however, that the appended drawings illustrate only typical embodiments of this invention and are therefore not to be considered limiting of its scope, for the invention may admit to other equally effective embodiments.

Figure 1:
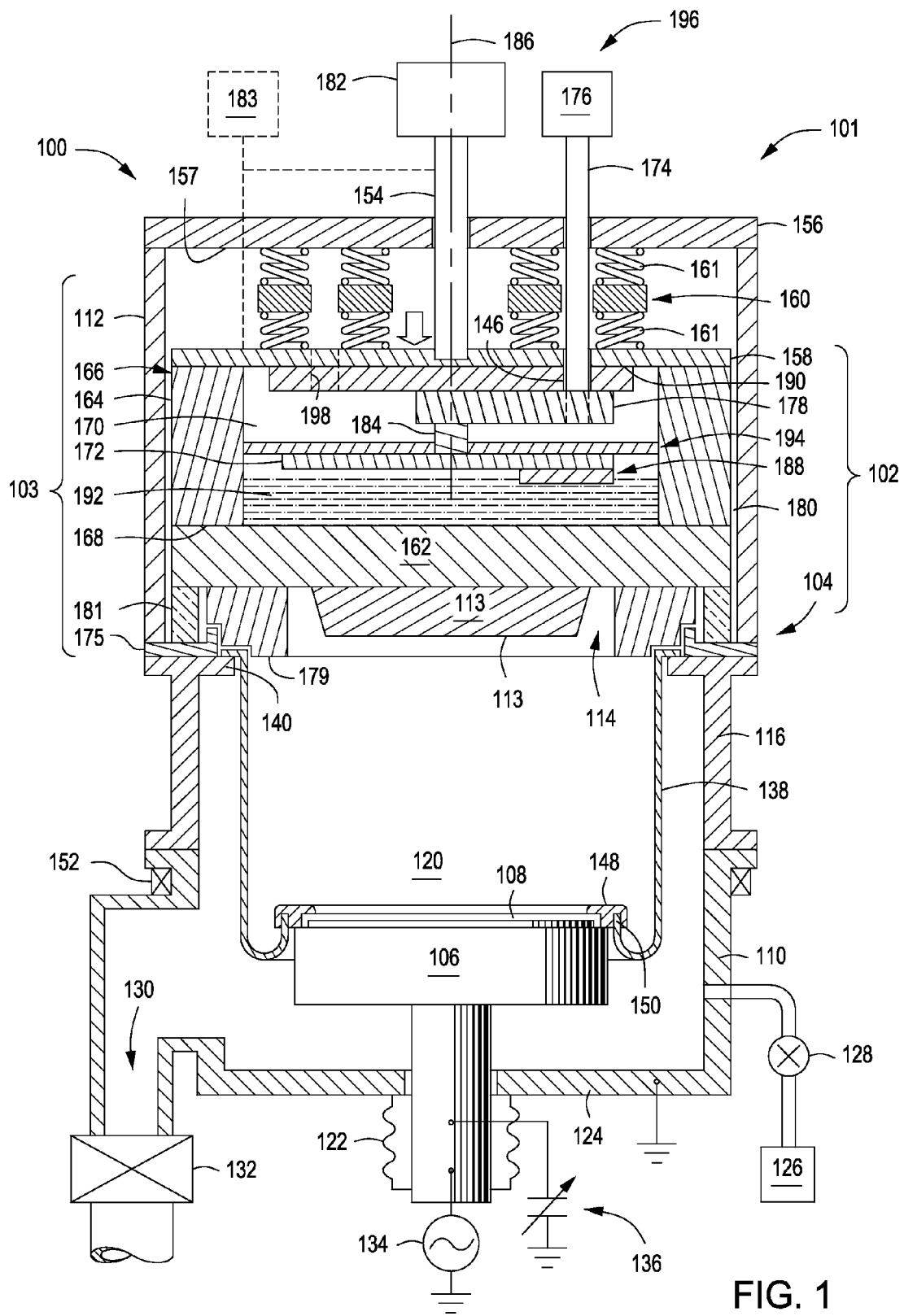
FIG. 1 depicts a schematic cross sectional view of a process chamber in accordance with some embodiments of the present invention.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

The present invention provides apparatus having an improved capability for forming a vacuum in a process chamber. In some embodiments, the process chamber includes a chamber lid having one or more biasing elements which compresses gaps separating non-vacuum regions from vacuum regions within the chamber lid. The improved seals established in the chamber lid between non-vacuum and vacuum regions can result in stronger vacuum forces applied to adjacent surfaces of the chamber lid and the chamber body. The improved seal and improved surface contact between the adjacent surfaces of the chamber lid and the chamber body can result in improved vacuum in the process chamber and/or reduced arcing between the adjacent surfaces.

FIG. 1 depicts a simplified, cross-sectional view of a physical vapor deposition (PVD) processing system 100 in accordance with some embodiments of the present invention. Examples of other PVD chambers suitable for modification in accordance with the teachings provided herein include the ALPS® Plus and SIP ENCORE® PVD processing chambers, both commercially available from Applied Materials, Inc., of Santa Clara, Calif. Other processing chambers from Applied Materials, Inc. or other manufactures, including those configured for other types of processing besides PVD, may also benefit from modifications in accordance with the teachings disclosed herein.

In some embodiments of the present invention, the PVD processing system 100 includes a chamber lid 101 removably disposed atop a process chamber 104. The chamber lid 101 may include a target assembly 102 and a grounding assembly 103. The process chamber 104 contains a substrate support 106 for receiving a substrate 108 thereon. The substrate support 106 may be located within a lower grounded enclosure wall 110, which may be a chamber wall of the process chamber 104. The lower grounded enclosure wall 110 may be electrically coupled to the grounding assembly 103 of the chamber lid 101 such that an RF return path is provided to an RF power source 182 disposed above the chamber lid 101. The RF power source 182 may provide RF power to the target assembly 102 as discussed below.

The substrate support 106 has a material-receiving surface facing a principal surface of a target 114 and supports the substrate 108 to be sputter coated in planar position opposite to the principal surface of the target 114. The substrate support 106 may support the substrate 108 in a central region 120 of the process chamber 104. The central region 120 is defined as the region above the substrate support 106 during processing (for example, between the target 114 and the substrate support 106 when in a processing position).

In some embodiments, the substrate support 106 may be vertically movable to allow the substrate 108 to be transferred onto the substrate support 106 through a load lock valve (not shown) in the lower portion of the process chamber 104 and thereafter raised to a deposition, or processing position. A bellows 122 connected to a bottom chamber wall 124 may be provided to maintain a separation of the inner volume of the process chamber 104 from the atmosphere outside of the process chamber 104 while facilitating vertical movement of the substrate support 106. One or more gases may be supplied from a gas source 126 through a mass flow controller 128 into the lower part of the process chamber 104. An exhaust port 130 may be provided and coupled to a pump (not shown) via a valve 132 for exhausting the interior of the process chamber 104 and to facilitate maintaining a desired pressure inside the process chamber 104.

An RF bias power source 134 may be coupled to the substrate support 106 in order to induce a negative DC bias on the substrate 108. In addition, in some embodiments, a negative DC self-bias may form on the substrate 108 during processing. For example, RF energy supplied by the RF bias power source 134 may range in frequency from about 2 MHz to about 60 MHz, for example, non-limiting frequencies such as 2 MHz, 13.56 MHz, or 60 MHz can be used. In other applications, the substrate support 106 may be grounded or left electrically floating. Alternatively or in combination, a capacitance tuner 136 may be coupled to the substrate support 106 for adjusting voltage on the substrate 108 for applications where RF bias power may not be desired.

The process chamber 104 further includes a process kit shield, or shield, 138 to surround the processing volume, or central region, of the process chamber 104 and to protect other chamber components from damage and/or contamination from processing. In some embodiments, the shield 138 may be connected to a ledge 140 of an upper grounded enclosure wall 116 of the process chamber 104. As illustrated in FIG. 1, the chamber lid 101 may rest on the ledge 140 of the upper grounded enclosure wall 116. Similar to the lower grounded enclosure wall 110, the upper grounded enclosure wall 116 may provide a portion of the RF return path between the lower grounded enclosure wall 116 and the grounding assembly 103 of the chamber lid 101. However, other RF return paths are possible, such as via the grounded shield 138.

The shield 138 extends downwardly and may include a generally tubular portion having a generally constant diameter that generally surrounds the central region 120. The shield 138 extends along the walls of the upper grounded enclosure wall 116 and the lower grounded enclosure wall 110 downwardly to below a top surface of the substrate support 106 and returns upwardly until reaching a top surface of the substrate support 106 (e.g., forming a u-shaped portion at the bottom of the shield 138). A cover ring 148 rests on the top of an upwardly extending inner portion of the bottom shield 138 when the substrate support 106 is in its lower, loading position but rests on the outer periphery of the substrate support 106 when it is in its upper, deposition position to protect the substrate support 106 from sputter deposition. An additional deposition ring (not shown) may be used to shield the periphery of the substrate 108 from deposition.

In some embodiments, a magnet 152 may be disposed about the process chamber 104 for selectively providing a magnetic field between the substrate support 106 and the target 114. For example, as shown in FIG. 1, the magnet 152 may be disposed about the outside of the chamber wall 110 in a region just above the substrate support 106 when in processing position. In some embodiments, the magnet 152 may be disposed additionally or alternatively in other locations, such as adjacent the upper grounded enclosure wall 116. The magnet 152 may be an electromagnet and may be coupled to a power source (not shown) for controlling the magnitude of the magnetic field generated by the electromagnet.

The chamber lid 101 generally includes the grounding assembly 103 disposed about the target assembly 102. The grounding assembly 103 may include a grounding plate 156 having a first surface 157 that may be generally parallel to and opposite a backside of the target assembly 102. A grounding shield 112 may extending from the first surface 157 of the grounding plate 156 and surround the target assembly 102. The grounding assembly 103 may include a support member 175 to support the target assembly 102 within the grounding assembly 102.

In some embodiments, the support member 175 may be coupled to a lower end of the grounding shield 112 proximate an outer peripheral edge of the support member 175 and extends radially inward to support a seal ring 181, the target assembly 102 and optionally, a dark space shield 179. The seal ring 181 may be a ring or other annular shape having a desired cross-section. The seal ring 181 may include two opposing planar and generally parallel surfaces to facilitate interfacing with the target assembly 102, such as the backing plate 162, on a first side of the seal ring 181 and with the support member 175 on a second side of the seal ring 181. The seal ring 181 may be made of a dielectric material, such as ceramic. The seal ring 181 may insulate the target assembly 102 from the ground assembly 103.

The dark space shield 179 is generally disposed about an outer edge of the target 114, such about an outer edge of a source material 113 of the target 114. In some embodiments, the seal ring 181 is disposed adjacent to an outer edge of the dark space shield 179 (i.e., radially outward of the dark space shield 179). In some embodiments, the dark space shield 179 is made of a dielectric material, such as ceramic. By providing a dielectric dark space shield 179, arcing between the dark space shield and adjacent components that are RF hot may be avoided or minimized. Alternatively, in some embodiments, the dark space shield 179 is made of a conductive material, such as stainless steel, aluminum, or the like. By providing a conductive dark space shield 179 a more uniform electric field may be maintained within the process processing system 100, thereby promoting more uniform processing of substrates therein. In some embodiments, a lower portion of the dark space shield 179 may be made of a conductive material and an upper portion of the dark space shield 179 may be made of a dielectric material.

The support member 175 may be a generally planar member having a central opening to accommodate the dark space shield 179 and the target 114. In some embodiments, the support member 175 may be circular, or disc-like in shape, although the shape may vary depending upon the corresponding shape of the chamber lid and/or the shape of the substrate to be processed in the process processing system 100. In use, when the chamber lid 101 is opened or closed, the support member 175 maintains the dark space shield 179 in proper alignment with respect to the target 114, thereby minimizing the risk of misalignment due to chamber assembly or opening and closing the chamber lid 101.

The target assembly 102 may include a source distribution plate 158 opposing a backside of the target 114 and electrically coupled to the target 114 along a peripheral edge of the target 114. The target 114 may comprise a source material 113 to be deposited on a substrate, such as the substrate 108 during sputtering, such as a metal, metal oxide, metal alloy, or the like. In some embodiments, the target 114 may include a backing plate 162 to support the source material 113. The source material 113 may be disposed on a substrate support facing side of the backing plate 162 as illustrated in FIG. 1. The backing plate 162 may comprise a conductive material, such as copper-zinc, copper-chrome, or the same material as the target, such that RF and DC power can be coupled to the source material 113 via the backing plate 162. Alternatively, the backing plate 162 may be non-conductive and may include conductive elements (not shown) such as electrical feedthroughs or the like.

A conductive member 164 may be disposed between the source distribution plate and the backside of the target 114 to propagate RF energy from the source distribution plate to the peripheral edge of the target 114. The conductive member 164 may be cylindrical, with a first end 166 coupled to a target-facing surface of the source distribution plate 158 proximate the peripheral edge of the source distribution plate 158 and a second end 168 coupled to a source distribution plate-facing surface of the target 114 proximate the peripheral edge of the target 114. In some embodiments, the second end 168 is coupled to a source distribution plate facing surface of the backing plate 162 proximate the peripheral edge of the backing plate 162.

The target assembly 102 may include a cavity 170 disposed between the backside of the target 114 and the source distribution plate 158. The cavity 170 may at least partially house a magnetron assembly 196 as discussed below. The cavity 170 is at least partially defined by the inner surface of the conductive member 164, a target facing surface of the source distribution plate 158, and a source distribution plate facing surface (e.g., backside) of the target 114 (or backing plate 162). In some embodiments, the cavity 170 may be at least partially filled with a cooling fluid 192, such as water ($H_2O$) or the like. In some embodiments, a divider 194 may be provided to contain the cooling fluid 192 in a desired portion of the cavity 170 (such as a lower portion, as shown) and to prevent the cooling fluid 192 from reaching components disposed on the other side of the divider 194, as discussed below.

An insulative gap 180 is provided between the grounding plate 156 and the outer surfaces of the source distribution plate 158, the conductive member 164, and the target 114 (and/or backing plate 162). The insulative gap 180 may be filled with air or some other suitable dielectric material, such as a ceramic, a plastic, or the like. The distance between the grounding plate 156 and the source distribution plate 158 depends on the dielectric material between the grounding plate 156 and the source distribution plate 158. Where the dielectric material is predominantly air, the distance between the grounding plate 156 and the source distribution plate 158 may be between 5 mm and 40 mm.

The grounding assembly 103 and the target assembly 102 may be electrically separated by the seal ring 181 and by one or more of insulators 160 disposed between the first surface 157 of the grounding plate 156 and the backside of the target assembly 102, e.g., a non-target facing side of the source distribution plate 158.

One or more biasing elements 161 may be disposed between the first surface 157 of the grounding plate 156 and the backside of the target assembly 102, e.g., the non-target facing side of the source distribution plate 158. The one or more biasing elements can be any suitable device that may be utilized to provide sufficient mechanical bias of the target assembly as described herein. For example, as illustrated in FIG. 1 and FIGS. 2A-C, the one or more biasing elements 161 may be springs. However, springs are merely one exemplary embodiment of the one or more biasing elements 161, and other mechanical biasing elements may be used alternatively or in combination.

The one or more biasing elements 161 bias the target assembly 102 towards the support member 175, such as to facilitate forming a seal between surfaces of the seal ring 181 and the surfaces of the target assembly 102 and the support member 175. As discussed further below, the formation of improved initial seals between the surfaces of the seal ring 181 and the surfaces of the target assembly 102 and the support member 175 may advantageously facilitate an improved seal between the chamber lid 101 and the upper ground enclosure wall 116 of the process chamber 104 which can result in lower vacuum pressures in the process chamber 104 as well as more rapidly obtaining such vacuum pressures. Further, improved seals between adjacent conducting surfaces, such as adjacent conductive surfaces of the chamber lid 101 and the upper ground enclosure wall 116 may reduce plasma arcing between the adjacent conductive surfaces.

Various configurations for the arrangement of the one or more biasing elements and the one or more insulators 160 are possible as illustrated in FIG. 1 and FIGS. 2A-C. In some embodiments, the one or insulators 160 may be symmetrically disposed about a central axis 186 of the PVD processing system 100. Alternatively, the one or more insulators 160 may be arranged in other non-symmetric configurations.

Figure 2C:
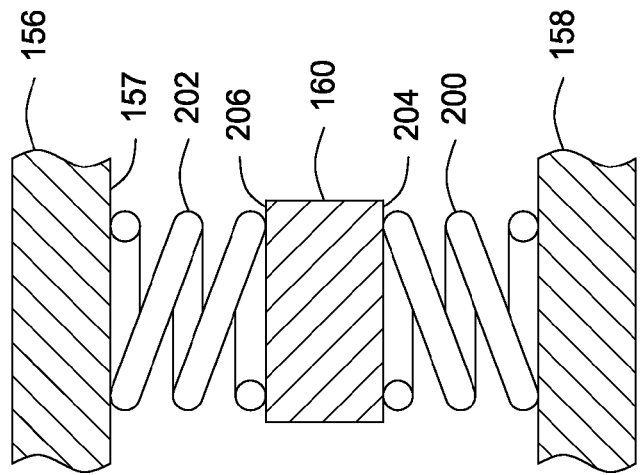
FIGS. 2A-C respectively depict embodiments of one or more biasing elements and surrounding structure of a process chamber lid in accordance with some embodiments of the present invention.
Figure 2B:
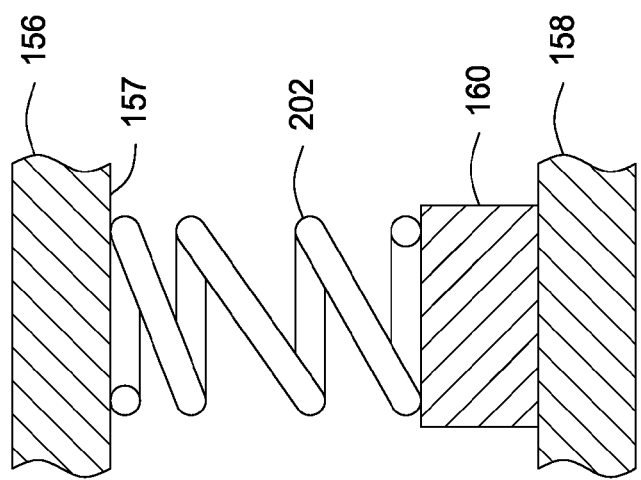
Figure 2A:
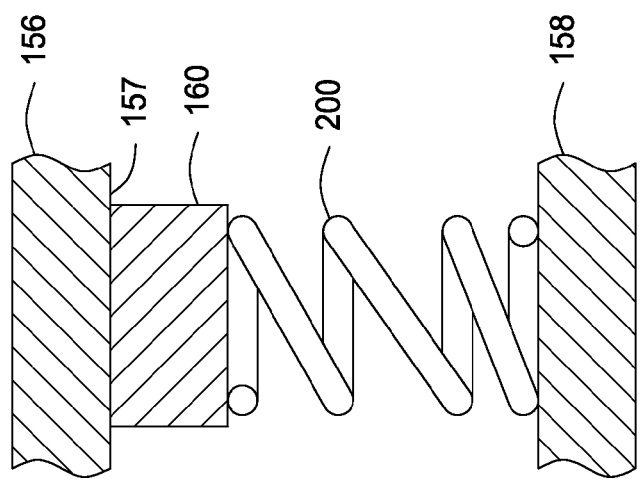

In some embodiments, as illustrated in FIG. 1 and FIG. 2A, each one or more biasing element 161 may comprise at least two biasing elements 200, 202. As illustrated in FIG. 1 and FIG. 2A, a first side 204 of the one or more insulators 160 may be coupled to the target assembly 102 (e.g., the non-target facing side of the source distribution plate 158) via the biasing element 200 and a second side 206 of the one or more insulators 160 may be coupled to the grounding assembly (e.g., the first surface 157 of the grounding plate 156) via the biasing element 202.

Alternatively, as illustrated in FIGS. 2B-C, the one or more biasing elements 161 may be disposed between either the grounding assembly 103 or the target assembly 102 and the one or more insulators 160. For example, as illustrated in FIG. 2B, the first side 204 of the one or more insulators 160 may be coupled to the target assembly 102 (e.g., directly to the non-target facing side of the source distribution plate 158) and the second side 206 of the one or more insulators 160 may be coupled to the first surface 157 of the grounding plate 156 via the biasing element 202. Alternatively, as illustrated in FIG. 2C, the first side 204 of the one or more insulators 160 may be coupled to the target assembly 102 via the via the biasing element 200 and the second side 206 of the one or more insulators 160 may be coupled to the grounding assembly 103 (e.g., directly to the first surface 157 of the grounding plate 156).

In other embodiments, the one or more insulators 160 and the one or more biasing elements 161 may be integrated such that they are not separate components. For example, the one or more biasing elements 161 may be fabricated from dielectric materials such that the one or more biasing elements 161 also act as the one or more insulators 160. In addition, other configurations of the one or more biasing elements 161 and one or more insulators 160 are possible, so long as the desired insulating and biasing functions are provided.

The various configurations of the one or more biasing elements 161 discussed above and illustrated in FIGS. 1 and 2A-C bias the target assembly 102 towards the support member 175 of the grounding assembly 103 to facilitate forming seals between surfaces of the target assembly 102, the grounding assembly 103 and the seal ring 181.

Figure 3:
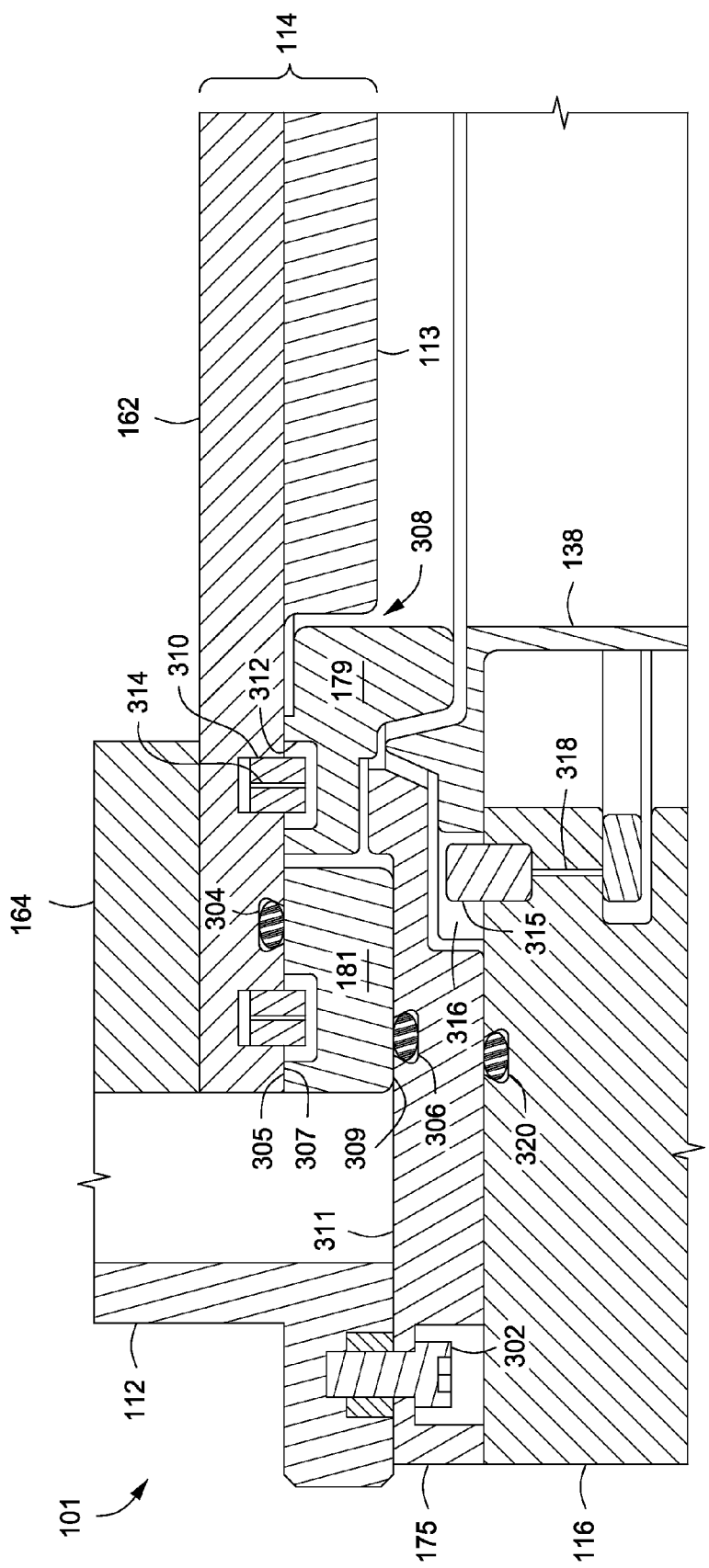
FIG. 3 depicts a partial sectional view of a support member of a process chamber lid and surrounding structure in accordance with some embodiments of the present invention.

For example, FIG. 3 depicts a more detailed view of the support member 175 and surrounding structure of the process processing system 100 of FIG. 1. In some embodiments, the support member 175 is coupled to the lower side of the grounding shield 112 proximate an outer periphery of the support member 175. In some embodiments, the support member 175 is coupled to the grounding shield 112 by a plurality of fasteners 302 such as bolts, or the like. In process chambers having other configurations of components, the one or more biasing elements 161 may be configured to bias portions of the chamber lid assembly together to facilitate enhancing the sealing capability of the lid assembly with respect to the chamber body.

When coupled to the grounding shield 112, the support member 175 in combination with the bias provided to the target assembly 102 by the one or more bias elements 161 facilitates forming a seal between portions of the process processing system 100 that are not held at vacuum (such as within the lid) and portions of the processing system 100 that may be held at vacuum (such as within the interior of the process chamber 104). For example, a first compressible element 304 may be disposed between a first side 305 of the seal ring 181 and a lower surface 307 of the target assembly 102 (e.g., the substrate support facing side of the backing plate 162). A second compressible element 306 may be disposed between a second surface 309 of the seal ring 181 and an upper surface 311 of the support member 175 such that, when the target assembly 102 is biased towards the support member 175 by the one or more biasing elements 161, sufficient force is applied to compress the first and second compressible elements 304, 306 to form a vacuum seal at those locations. The first and second compressible elements 304, 306, as well as other compressible elements discussed herein, may be any suitable material to provide a seal, such as an o-ring, a gasket, or the like. In some embodiment, a third compressible element 320 may be provided between the support member 175 and the upper grounded enclosure wall 116 to provide a seal between a lower surface of the support member 175 and a support member facing surface of the upper grounded enclosure wall 116 when the chamber lid 101 is in a closed position atop the upper grounded enclosure wall 116 of the process chamber 104.

The one or more biasing elements 161 bias the target assembly 102 towards the support member 175 such that the first and second compressible elements 304, 306 are compressed, at least partially, such that there is a reduced, minimal, or no gas flow gap between adjacent surfaces of the target assembly 102 and the seal ring 181, or adjacent surfaces of the support member 175 and the seal ring 181. Accordingly, when a vacuum is applied to seal the chamber lid 101 to the process chamber 104 and reduce the pressure within the process chamber 104, the force applied to the third compressible element 320 may be greater, which can result in an improved seal between the lower surface of the support member 175 and the upper grounded enclosure wall 116. For example, "improved seal" may mean improved surface contact between adjacent surfaces of the support member 175 and the upper grounded enclosure wall 116 and/or improved compression of the third compressible element 320 such that a better vacuum is formed in the process chamber 104. Improved surface contact may limit plasma arcing between adjacent surfaces of support member 175 and the upper grounded enclosure wall 116.

In some embodiments, alignment features may be provided to maintain a gap 308 between the inner wall of the dark space shield 179 and the outer edge of the target 114. The alignment features may facilitate maintaining a more uniform gap and may prevent contact or near contact of the dark space shield 179 and the target 114 that may undesirably lead to arcing. In some embodiments, the radial gap is in the range of 0.003 to 0.030 inches. For example, in some embodiments, a plurality of pins 310 may extend from a bottom surface of the backing plate 162. For example, the pins may be press fit or otherwise secured with corresponding holes formed in the backing plate 162. The pins 310 include portions that extend in a substantially normal direction from the bottom surface of the backing plate 162 to interface with, or fit into, a corresponding plurality of slots 312 disposed within a top surface of the dark space shield 179. In some embodiments, there are at least three sets of alignment features (e.g., three pins 310 and three slots 312) that prevent the side-to-side movement of the dark space shield 179 and the maintain the gap 308 between the inner wall of the dark space shield 179 and the outer edge of the target 114. The slots 312 may be radially aligned such that a radial length of the slot 312 is greater than the diameter of the pins 310 to facilitate relative movement of the dark space shield 179 and the backing plate 162 due to differences in rates of thermal expansion and contraction, while maintaining alignment between the dark space shield 179 and the backing plate 162. In some embodiments, each pin 310 may have a hollow passageway 314 disposed axially through the pin 310 to allow evacuation of gases trapped within the alignment features.

In some embodiments, a plurality of alignment features may be provided to maintain the shield 138 in a desired position. For example, as shown in FIG. 3, in some embodiments, a plurality of pins 315 may extend from a surface of the upper grounded enclosure wall 116. For example, the pins may be press fit or otherwise secured with corresponding holes formed in the upper grounded enclosure wall 116. The pins 315 include portions that extend in a substantially normal direction from the surface of the upper grounded enclosure wall 116 to interface with, or fit into, a corresponding plurality of slots 316 disposed within the shield 138. In some embodiments, there are at least three sets of alignment features (e.g., three pins 315 and three slots 316) that prevent the side-to-side movement of the shield 138 and the maintain the alignment of the shield 138 and the dark space shield 179. The slots 316 may be radially aligned such that a radial length of the slot 316 is greater than the diameter of the pins 315 to facilitate relative movement of the shield 138 and the upper grounded enclosure wall 116 due to differences in rates of thermal expansion and contraction, while maintaining alignment between the shield 138 and the dark space shield 179. In some embodiments, a passageway 318 may be provided through upper grounded enclosure wall 116 to prevent trapping of gases when installing the pins 315. In some embodiments, one or more fasteners may be provided to secure the shield 138 to the upper grounded enclosure wall 116.

Returning to FIG. 1, the target assembly 102 has an RF power source 182 connected to an electrode 154 (e.g., a RF feed structure). The RF power source 182 may include an RF generator and a matching circuit, for example, to minimize reflected RF energy reflected back to the RF generator during operation. For example, RF energy supplied by the RF power source 182 may range in frequency from about 13.56 MHz and to about 162 MHz or above. For example, non-limiting frequencies such as 13.56 MHz, 27.12 MHz, 60 MHz, or 162 MHz can be used.

In some embodiments, a second energy source 183 may be coupled to the target assembly 102 to provide additional energy to the target 114 during processing. In some embodiments, the second energy source 183 may be a DC power source to provide DC energy, for example, to enhance a sputtering rate of the target material (and hence, a deposition rate on the substrate). In some embodiments, the second energy source 183 may be a second RF power source, similar to the RF power source 182, to provide RF energy, for example, at a second frequency different than a first frequency of RF energy provided by the RF power source 182. In embodiments where the second energy source 183 is a DC power source, the second energy source may be coupled to the target assembly 102 in any location suitable to electrically couple the DC energy to the target 114, such as the electrode 154 or some other conductive member (such as the source distribution plate 158, discussed below). In embodiments where the second energy source 183 is a second RF power source, the second energy source may be coupled to the target assembly 102 via the electrode 154.

The electrode 154 may be cylindrical or otherwise rod-like and may be aligned with a central axis 186 of the process chamber 104 (e.g., the electrode 154 may be coupled to the target assembly at a point coincident with a central axis of the target, which is coincident with the central axis 186). The electrode 154, aligned with the central axis 186 of the process chamber 104, facilitates applying RF energy from the RF source 182 to the target 114 in an axisymmetrical manner (e.g., the electrode 154 may couple RF energy to the target at a "single point" aligned with the central axis of the PVD chamber). The central position of the electrode 154 helps to eliminate or reduce deposition asymmetry in substrate deposition processes. The electrode 154 may have any suitable diameter, however, the smaller the diameter of the electrode 154, the closer the RF energy application approaches a true single point. For example, although other diameters may be used, in some embodiments, the diameter of the electrode 154 may be about 0.5 to about 2 inches. The electrode 154 may generally have any suitable length depending upon the configuration of the PVD chamber. In some embodiments, the electrode may have a length of between about 0.5 to about 12 inches. The electrode 154 may be fabricated from any suitable conductive material, such as aluminum, copper, silver, or the like.

The electrode 154 may pass through the grounding plate 156 and is coupled to a source distribution plate 158. The grounding plate 156 may comprise any suitable conductive material, such as aluminum, copper, or the like. The open spaces between the one or more insulators 160 allow for RF wave propagation along the surface of the source distribution plate 158. In some embodiments, the one or more insulators 160 may be symmetrically positioned with respect to the central axis 186 of the process chamber 104 Such positioning may facilitate symmetric RF wave propagation along the surface of the source distribution plate 158 and, ultimately, to a target 114 coupled to the source distribution plate 158. The RF energy may be provided in a more symmetric and uniform manner as compared to conventional PVD chambers due, at least in part, to the central position of the electrode 154

One or more portions of a magnetron assembly 196 may be disposed at least partially within the cavity 170. The magnetron assembly provides a rotating magnetic field proximate the target to assist in plasma processing within the process chamber 104. In some embodiments, the magnetron assembly 196 may include a motor 176, a motor shaft 174, a gearbox 178, a gearbox shaft 184, and a rotatable magnet (e.g., a plurality of magnets 188 coupled to a magnet support member 172).

In some embodiments, the magnetron assembly 196 is rotated within the cavity 170. For example, in some embodiments, the motor 176, motor shaft 174, gear box 178, and gearbox shaft 184 may be provided to rotate the magnet support member 172. In conventional PVD chambers having magnetrons, the magnetron drive shaft is typically disposed along the central axis of the chamber, preventing the coupling of RF energy in a position aligned with the central axis of the chamber. To the contrary, in embodiments of the present invention, the electrode 154 is aligned with the central axis 186 of the PVD chamber. As such, in some embodiments, the motor shaft 174 of the magnetron may be disposed through an off-center opening in the grounding plate 156. The end of the motor shaft 174 protruding from the grounding plate 156 is coupled to a motor 176. The motor shaft 174 is further disposed through a corresponding off-center opening through the source distribution plate 158 (e.g., a first opening 146) and coupled to a gear box 178. In some embodiments, one or more second openings 198 may be disposed though the source distribution plate 158 in a symmetrical relationship to the first opening 146 to advantageously maintain axisymmetric RF distribution along the source distribution plate 158. The one or more second openings 198 may also be used to allow access to the cavity 170 for items such as optical sensors or the like.

The gear box 178 may be supported by any suitable means, such as by being coupled to a bottom surface of the source distribution plate 158. The gear box 178 may be insulated from the source distribution plate 158 by fabricating at least the upper surface of the gear box 178 from a dielectric material, or by interposing an insulator layer 190 between the gear box 178 and the source distribution plate 158, or the like. The gear box 178 is further coupled to the magnet support member 172 via the gear box shaft 184 to transfer the rotational motion provided by the motor 176 to the magnet support member 172 (and hence, the plurality of magnets 188).

The magnet support member 172 may be constructed from any material suitable to provide adequate mechanical strength to rigidly support the plurality of magnets 188. For example, in some embodiments, the magnet support member 188 may be constructed from a non-magnetic metal, such as non-magnetic stainless steel. The magnet support member 172 may have any shape suitable to allow the plurality of magnets 188 to be coupled thereto in a desired position. For example, in some embodiments, the magnet support member 172 may comprise a plate, a disk, a cross member, or the like. The plurality of magnets 188 may be configured in any manner to provide a magnetic field having a desired shape and strength.

Alternatively, the magnet support member 172 may be rotated by any other means with sufficient torque to overcome the drag caused on the magnet support member 172 and attached plurality of magnets 188, for example due to the cooling fluid 192, when present, in the cavity 170. For example, in some embodiments, (not shown), the magnetron assembly 196 may be rotated within the cavity 170 using a motor 176 and motor shaft 174 disposed within the cavity 170 and directly connected to the magnet support member 172 (for example, a pancake motor). The motor 176 must be sized sufficiently to fit within the cavity 170, or within the upper portion of the cavity 170 when the divider 194 is present. The motor 176 may be an electric motor, a pneumatic or hydraulic drive, or any other process-compatible mechanism that can provide the required torque.

While the foregoing is directed to embodiments of the present invention, other and further embodiments of the invention may be devised without departing from the basic scope thereof.

The invention claimed is:

1. A substrate processing system, comprising:
   a target assembly having a target comprising a source material to be deposited on a substrate;
   a grounding assembly disposed about the target assembly and having a first surface that is generally parallel to and opposite a backside of the target assembly, wherein the grounding assembly is electrically separated from the target assembly;
   a support member coupled to the grounding assembly to support the target assembly within the grounding assembly;
   one or more insulators disposed between the backside of the target assembly and the first surface of the grounding assembly; and
   one or more biasing elements disposed between the first surface of the grounding assembly and the backside of the target assembly to bias the target assembly toward the support member.

2. The substrate processing system of claim 1, further comprising:
   a seal ring disposed between the target assembly and the support member, wherein the seal ring includes a first side opposing a lower surface of the target assembly and a second side opposing an upper surface of the support member.

3. The substrate processing system of claim 2, further comprising:
   a first compressible element disposed between the first side of the seal ring and the lower surface of the target assembly that forms a seal between the first side and the lower surface of the target assembly when compressed by the one or more biasing elements; and
   a second compressible element disposed between the second side of the seal ring and the upper surface of the support member that forms a seal between the second side and the upper surface of the support member when compressed by the one or more biasing elements.

4. The substrate processing system of claim 3, further comprising:
   a chamber body disposed below the support member and having an upper surface opposing a lower surface of the support member; and
   a third compressible element disposed between the upper surface of the chamber body and the lower surface of the support member that forms a seal between the upper surface of the chamber body and the lower surface of the support member when compressed by the one or more biasing elements.

5. The substrate processing system of claim 1, wherein the target assembly further comprises:
   a source distribution plate opposing a backside of the target and electrically coupled to the target along a peripheral edge of the target, wherein the source distribution plate is coupled to at least one of the one or more insulators or the one or more biasing elements; and
   a conductive member disposed between the backside of the target and the source distribution plate to propagate RF energy from the source distribution plate to the peripheral edge of the target.

6. The substrate processing system of claim 5, wherein the target further comprises:
   a backing plate to support the source material, wherein the backing plate is coupled to a bottom side of the conductive member and wherein the source material is disposed on a conductive member opposing surface of the backing plate.

7. The substrate processing system of claim 5, wherein the target assembly further comprises:
   a cavity disposed between the backside of the target and the source distribution plate; and
   a magnetron assembly comprising a rotatable magnet disposed within the cavity and having an axis of rotation that is aligned with a central axis of the target.

8. The substrate processing system of claim 5, further comprising:
   an RF feed structure coupled to the source distribution plate to provide RF energy to the source distribution plate, wherein the RF feed structure is aligned with a central axis of the target.

9. The substrate processing system of claim 1, wherein the grounding assembly further comprises:
   a grounding plate including the first surface and opposing the target assembly, wherein the grounding plate is coupled to at least one of the one or more insulators or the one or more biasing elements; and
   a grounding shield extending from the first surface of the grounding plate and surrounding the target assembly, wherein the support member is coupled to a lower side of the grounding shield.

10. The substrate processing system of claim 1, wherein a first side of the one or more insulators is coupled to the target assembly and a second side of the one or more insulators is coupled to the grounding assembly via the one or more biasing elements.

11. The substrate processing system of claim 1, wherein a first side of the one or more insulators is coupled to the target assembly via the one or more biasing elements and a second side of the one or more insulators is coupled to the first surface of the grounding assembly.

12. The substrate processing system of claim 1, wherein the one or more biasing elements further comprises at least two biasing elements and wherein a first side of the one or more insulators is coupled to the target assembly via one of the at least two biasing elements and a second side of the one or more insulators is coupled to the grounding assembly via another of the at least two biasing elements.

13. A substrate processing system, comprising:
   a target assembly having a target comprising a source material to be deposited on a substrate and having a source distribution plate opposing a backside of the target and electrically coupled to the target along a peripheral edge of the target;
   a grounding assembly disposed about the target assembly and having a first surface that is generally parallel to and opposite a backside of the target assembly, wherein the grounding assembly is electrically separated from the target assembly;
   a support member coupled to the grounding assembly to support the target assembly within the grounding assembly;
   one or more insulators disposed between the source distribution plate and the first surface of the grounding assembly; and one or more biasing elements disposed between the first surface of the grounding assembly and the source distribution plate to bias the target assembly toward the support member.

14. The substrate processing system of claim 13, wherein the grounding assembly comprises:
   a grounding plate including the first surface and opposing the target assembly, wherein the grounding plate is coupled to at least one of the one or more insulators or the one or more biasing elements; and
   a grounding shield extending from the first surface of the grounding plate and surrounding the target assembly, wherein the support member is coupled to a lower side of the grounding shield.

15. The substrate processing system of claim 14, further comprising:
   a seal ring disposed between the target assembly and the support member, wherein the seal ring includes a first side opposing a lower surface of the target assembly and a second side opposing an upper surface of the support member;
   a first compressible element disposed between the first side of the seal ring and the lower surface of the target assembly that forms a seal between the first side and the lower surface of the target assembly when compressed by the one or more biasing elements; and
   a second compressible element disposed between the second side of the seal ring and the upper surface of the support member that forms a seal between the second side and the upper surface of the support member when compressed by the one or more biasing elements.

16. The substrate processing system of claim 15, further comprising:
   a chamber body disposed below the support member and having an upper surface opposing a lower surface of the support member; and
   a third compressible element disposed between the upper surface of the chamber body and the lower surface of the support member that forms a seal between the upper surface of the chamber body and the lower surface of the support member when compressed by the one or more biasing elements.

17. The substrate processing system of claim 16, wherein the target assembly further comprises:
   a cavity disposed between the backside of the target and the source distribution plate; and
   a magnetron assembly comprising a rotatable magnet disposed within the cavity and having an axis of rotation that is aligned with a central axis of the target and a shaft disposed through an opening in the source distribution plate that is not aligned with the central axis of the target and rotationally coupled to the rotatable magnet; and
   an RF feed structure coupled to the source distribution plate to provide RF energy to the source distribution plate, wherein the RF feed structure is aligned with a central axis of the target.

18. The substrate processing system of claim 17, wherein a first side of the one or more insulators is coupled to a target opposing side of the source distribution plate and a second side of the one or more insulators is coupled to the first surface of the grounding plate via the one or more biasing elements.

19. The substrate processing system of claim 17, wherein a first side of the one or more insulators is coupled to a target opposing side of the source distribution plate via the one or more biasing elements and a second side of the one or more insulators is coupled to the first surface of the grounding plate.

20. The substrate processing system of claim 17, wherein the one or more biasing elements further comprises at least two biasing elements and wherein a first side of the one or more insulators is coupled to a target opposing side of the source distribution plate via one of the at least two biasing elements and a second side of the one or more insulators is coupled to the first surface of the grounding plate via another of the at least two biasing elements.

* * * * *